(12) United States Patent
Hessler

(10) Patent No.: US 9,016,932 B2
(45) Date of Patent: Apr. 28, 2015

(54) RESONATOR THERMOCOMPENSATED BY A SHAPE-MEMORY METAL

(71) Applicant: The Swatch Group Research and Development Ltd, Marin (CH)

(72) Inventor: Thierry Hessler, St-Aubin (CH)

(73) Assignee: The Swatch Group Research and Development Ltd, Marin (CH)

( * ) Notice: Subject to any disclaimer, the term of this patent is extended or adjusted under 35 U.S.C. 154(b) by 0 days.

(21) Appl. No.: 14/170,874

(22) Filed: Feb. 3, 2014

(65) Prior Publication Data

US 2014/0219067 A1 Aug. 7, 2014

(30) Foreign Application Priority Data

Feb. 7, 2013 (EP) .................................... 13154432

(51) Int. Cl.
| | | |
|---|---|---|
| *G04B 17/22* | (2006.01) | |
| *H01L 41/04* | (2006.01) | |
| *G04C 3/00* | (2006.01) | |
| *G04B 17/06* | (2006.01) | |
| *H03H 9/02* | (2006.01) | |
| *G04C 3/12* | (2006.01) | |
| *H03H 9/17* | (2006.01) | |
| *H03H 9/21* | (2006.01) | |

(52) U.S. Cl.
CPC *H01L 41/04* (2013.01); *G04C 3/00* (2013.01); *G04C 3/12* (2013.01); *G04B 17/222* (2013.01); *G04B 17/066* (2013.01); *G04B 17/227* (2013.01); *H03H 9/02448* (2013.01); *H03H 9/176* (2013.01); *H03H 9/21* (2013.01)

(58) Field of Classification Search
CPC ...... G04B 17/222; G04B 17/22; G04B 17/00; G04C 3/12
USPC .................................. 368/167–171; 310/346
See application file for complete search history.

(56) References Cited

U.S. PATENT DOCUMENTS

| | | | | |
|---|---|---|---|---|
| 5,617,377 | A * | 4/1997 | Perret, Jr. ...................... | 368/282 |
| 8,100,579 | B2 * | 1/2012 | Levingston .................... | 368/171 |
| 2002/0027834 | A1* | 3/2002 | Thalheim ...................... | 368/276 |
| 2004/0109390 | A1* | 6/2004 | Born ............................. | 368/203 |

(Continued)

FOREIGN PATENT DOCUMENTS

| | | |
|---|---|---|
| CH | 699 780 A2 | 4/2010 |
| CH | 701 770 A2 | 3/2011 |

(Continued)

OTHER PUBLICATIONS

European Search Report issued Jul. 4, 2013 in European Application 13154432, filed on Feb. 7, 2013 ( with English Translation).

*Primary Examiner* — Sean Kayes
(74) *Attorney, Agent, or Firm* — Oblon, McClelland, Maier & Neustadt, L.L.P.

(57) ABSTRACT

The invention relates to a thermocompensated resonator comprising a body used in deformation, the core of the body being formed by a first material. According to the invention, at least one part of the body comprises at least one coating made of shape-memory metal, the variations in the Young's modulus of which as a function of the temperature (CTE) are of opposite sign to those (CTE) of the first material used for the core so as to allow said resonator to have a frequency variation as a function of the temperature which is substantially zero at least to the first order ($\alpha$, $\beta$).

12 Claims, 2 Drawing Sheets

(56) References Cited

U.S. PATENT DOCUMENTS

| | | | |
|---|---|---|---|
| 2008/0101162 A1* | 5/2008 | Born | 368/132 |
| 2011/0305120 A1 | 12/2011 | Hessler et al. | |
| 2013/0100782 A1* | 4/2013 | Cattaneo et al. | 368/308 |
| 2014/0071797 A1* | 3/2014 | Knuchel et al. | 368/319 |
| 2014/0169144 A1* | 6/2014 | Briswalter et al. | 368/319 |

FOREIGN PATENT DOCUMENTS

| | | |
|---|---|---|
| EP | 1 422 436 A1 | 5/2004 |
| EP | 2 395 661 A1 | 12/2011 |
| JP | 10-9315 | 1/1998 |
| JP | 2003-65213 | 3/2003 |
| WO | WO 2008/043727 A1 | 4/2008 |

* cited by examiner

RESONATOR THERMOCOMPENSATED BY A SHAPE-MEMORY METAL

This application claims priority from European patent application No. 13154432.2 filed on Feb. 7, 2013, the entire disclosure of which is hereby incorporated by reference.

FIELD OF THE INVENTION

The invention relates to a thermocompensated resonator of the sprung balance or tuning fork type which makes it possible to manufacture a time or frequency base, the thermal coefficients of which are substantially zero to the first order or even to the second order.

BACKGROUND OF THE INVENTION

The European Patent No. EP 1 422 436 discloses a balance spring formed in silicon and covered with silicon dioxide so as to make the thermal coefficient substantially zero around the COSC procedure temperatures, i.e. between +8 and +38° C. Likewise, the document WO 2008-043727 discloses a MEMS resonator which has similar qualities of low variation of its Young's modulus within the same temperature range.

However, the variation of the frequency of the disclosures above can require complex corrections according to the applications. For example, for electronic quartz watches to be able to be COSC certified, an electronic correction based on a measure of the temperature must be effected.

SUMMARY OF THE INVENTION

The aim of the present invention is to remedy all or part of the disadvantages cited above by proposing a resonator thermocompensated at least to the first order.

To this end, the invention relates to a thermocompensated resonator comprising a body used in deformation, the core of the body being formed by a first material, characterised in that at least one part of the body comprises at least one coating made of shape-memory metal, the variations in the Young's modulus of which as a function of the temperature are of opposite sign to those of the first material used for the core so as to allow said resonator to have a frequency variation as a function of the temperature which is substantially zero at least to the first order.

Advantageously according to the invention, the body of the resonator used in deformation can comprise a single coating for compensating for one or two orders. Thus, according to the sizes and the signs of each order of the coating material, calculation of the thickness of the coating is effected so as to compensate for at least the first order.

According to other advantageous feature of the invention:
- the core of the body comprises glass, metallic glass, technical ceramic, ceramic glass, monocrystalline silicon which is doped or not, polycrystalline silicon which is doped or not, or quartz;
- said at least one coating comprises an alloy based on Cu—Zn, Co—Ni, Ni—Ti or Cu—Al;
- the body comprises a section which is substantially in the shape of a quadrilateral, the faces of which are identical in pairs;
- the body comprises a section which is substantially in the shape of a quadrilateral, the faces of which are completely coated;
- said at least one coating forms a barrier against humidity;
- said at least one coating is paramagnetic or diamagnetic;
- the body is a bar which is coiled on itself forming a balance spring and is coupled to a flywheel;
- the body comprises at least two bars which are mounted symmetrically so as to form a tuning fork.

Finally, the invention relates likewise to a time or frequency base, such as for example a timepiece, characterised in that it comprises at least one resonator according to one of the preceding variants.

BRIEF DESCRIPTION OF THE DRAWINGS

Other features and advantages will emerge clearly from the description which is given hereafter, by way of example and in no way limiting, with reference to the annexed drawings, in which.

DETAILED DESCRIPTION OF PREFERRED EMBODIMENTS

Figure 4:
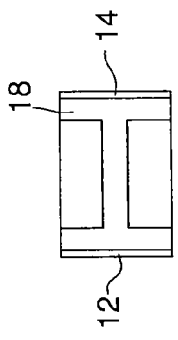
FIGS. 3 and 4 are alternatives of sections of a resonator according to the invention.

As explained above, the invention relates to a timepiece comprising a resonator which can be of the sprung balance or tuning fork type. However, other applications for the resonator will be producible for a person skilled in the art without great difficulty from the teaching below.

By way of definition, the relative variation of the frequency of a resonator follows the following relation:

$$\frac{\Delta f}{f_0} = A + \alpha \cdot (T - T_0) + \beta \cdot (T - T_0)^2 + \gamma \cdot (T - T_0)^3$$

where:

$$\frac{\Delta f}{f_0}$$

is the relative variation of frequency (ppm or $10^{-6}$);
- A a constant which depends upon the reference point (ppm);
- T the current temperature (° C.);
- $T_0$ the reference temperature (° C.);
- α the thermal coefficient of the first order (ppm.° C.$^{-1}$);
- β the thermal coefficient of the second order (ppm.° C.$^{-2}$);
- γ the thermal coefficient of the third order (ppm.° C.$^{-3}$).

Furthermore, the thermoelastic coefficient (CTE) represents the relative variation in the Young's modulus as a function of the temperature. The terms "α" and "β" which are used below thus represent respectively the thermal coefficients of the first and second orders, i.e. the relative variation of the frequency of the resonator as a function of the temperature. The terms "α" and "β" depend upon the thermoelastic coefficient of the body of the resonator and upon the expansion coefficients of the body. Furthermore, the terms "α" and "β" likewise take into account the coefficients which are characteristic of a possible separate inertia, such that for example the balance wheel (forming a flywheel) for a sprung balance resonator.

The oscillations of the whole resonator intended for a time or frequency base requiring to be maintained, the thermal dependency likewise comprises a possible contribution to the maintenance system.

The most important parameter is therefore the thermoelastic coefficient (CTE) which must not be confused with the English abbreviation CTE for "Constant of Thermal Expansion" which concerns the expansion coefficient.

The thermoelastic coefficient (CTE) of most metals is very negative, of the order of −1,000 ppm. $°C.^{-1}$. Consequently, it is inconceivable to use them to produce a balance spring. Complex alloys have therefore been developed, such as Nivarox CT, in order to address this problem. They remain nevertheless difficult to control in particular with respect to the manufacture thereof.

Advantageously, the invention relates to alternative materials for forming said resonators. The invention relates thus to a thermocompensated resonator 1, 11 comprising a body 5, 15 which is used in deformation, the core 8, 18 of the body 5, 15 being formed by a first material, such as a ceramic, a silicon-based material or a quartz-based material.

A ceramic can be considered as an article having a vitrified body or not, of a crystalline or partially crystalline structure, or of glass, the body of which is formed from essentially inorganic, metallic substances or not, and which is formed by a molten mass which solidifies when cooling, or which is formed and matured, at the same or subsequently, by the action of the heat.

A ceramic according to the invention includes therefore in particular simple glasses, metallic glasses, technical ceramics, such as silicon carbide or ceramic glasses.

A silicon-based material can be, for example, monocrystalline silicon, polycrystalline silicon, monocrystalline silicon which is doped or polycrystalline silicon which is doped, those which are able to include a native oxide layer or an oxide layer of greater thickness than the native oxide. Finally the quartz-based material is preferably a natural or synthetic silica which is crystallised in the trigonal shape of the alpha or beta type.

Advantageously according to the invention, at least one part of the body 5, 15 comprises at least one coating 2, 4, 6, 12, 14, 16 made of shape-memory metal, the variations in the Young's modulus of which as a function of the temperature $CTE_1$ are of opposite sign to those $CTE_2$ of the first material used for the core 8, 18 so as to allow said resonator to have a frequency variation as a function of the temperature which is substantially zero at least to the first order α, β.

Said at least one coating, 2, 4, 6, 12, 14, 16 made of shape-memory metal can comprise for example an alloy based on Ag—Cd, Au—Cd, Co—Ni, Cu—Al, Cu—Mn, Cu—Sn, Cu—Zn, Fe—Mn—Si, Fe—Ni, Fe—Pt, Ni—Ti, Ni—Mn or Ti—Pd. Nevertheless, said at least one coating 2, 4, 6, 12, 14, 16 preferably comprises an alloy based on Cu—Zn, Co—Ni, Ni—Ti or Cu—Al.

In fact, it is of interest that the coating can be electrically conductive and not particularly sensitive to magnetic fields so as to avoid parasitic displacement relative to the predetermined trajectory of the body. Furthermore, these shape-memory metals are advantageously chemically very stable. By way of example, they are very resistant to cleaning and insensitive to humidity which makes them an excellent barrier against humidity.

Figure 2:
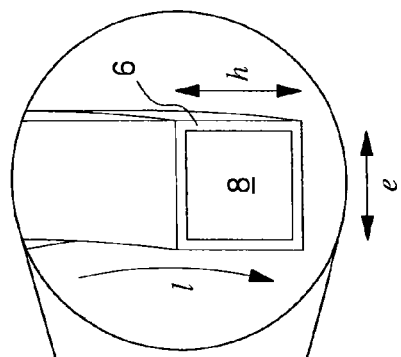
FIG. 2 is a representative section of the spiral spring of FIG. 1.
Figure 1:
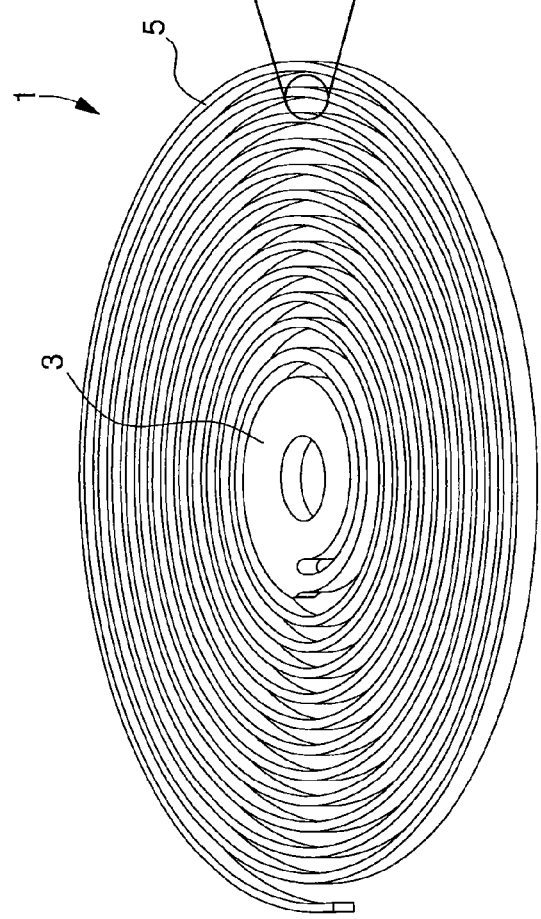
FIG. 1 is a perspective representation of a part of a sprung balance resonator.

In the example illustrated in FIGS. 1 and 2, a balance spring 1 can be seen, the body 5 of which is integral with its collet 3 and the thermal coefficients of which to the first order α or even to the second order β are compensated for by the use of two materials for respectively the core 8 and the coating 6. FIG. 2 suggests a section of the body 5 of the balance spring 1 which makes it possible to see more clearly its section in the shape of a quadrilateral. The body 5 can therefore be defined by its length l, its height h and its thickness e.

Figure 3:
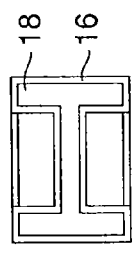

FIG. 2 shows an example where the core 8 is completely coated. Of course FIG. 2 shows only one non-limiting example. Thus, the balance spring 1 can comprise a coating 2, 4, 6 over at least one part such as one or a plurality of faces or even the totality of the exterior surface of the body 5, such as the examples illustrated in FIGS. 3 and 4. For information, the coatings 2, 4, 6 are not to scale relative to the dimensions of the core 8, this is in order to show more clearly the locations of each part.

It is therefore understood that the body according to the invention can comprise, in a non-limiting way, a section which is substantially in the shape of a quadrilateral, a single face of which is coated or the faces of which are identical in pairs or even the faces of which are completely coated identically or not.

Figure 5:
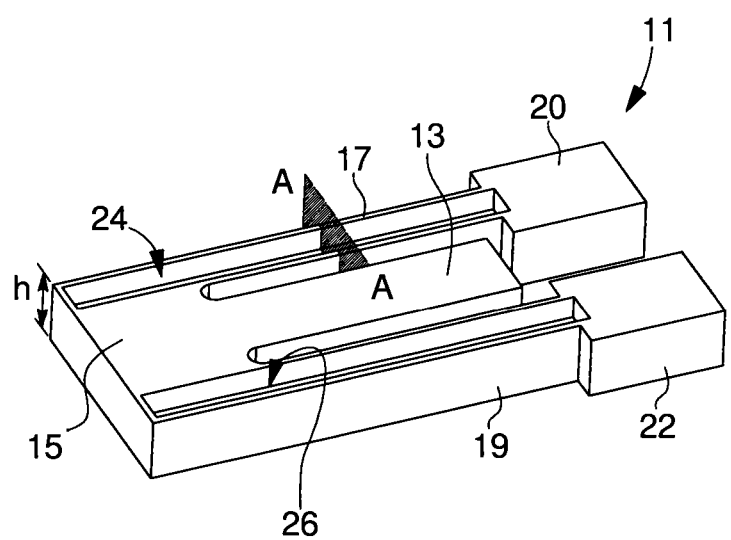
FIG. 5 is a general representation in perspective of a resonator of the tuning fork type.

Similarly, advantageously according to the invention, a resonator 11 of the tuning fork type can be seen in FIG. 5. The body 15 of the resonator is formed by a base 13 which is connected to two arms 17, 19 which are intended to vibrate. By way of example, the tuning fork 11 which is used is of the reverse type, i.e. the base 13 extends between the two arms 17, 19, of the palmate type, i.e. the two arms 17, 19 comprise, at their end, palms 20, 22 and of the grooved type, i.e. the two arms 17, 19 comprise grooves 24, 26. However, it is understood that there is a multitude of possible variants of tuning forks which can, in a non-exhaustive manner, be of the reverse type and/or of the grooved type and/or of the conical type and/or of the palmate type.

Figure 6:
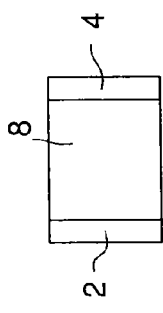
FIGS. 6 and 7 are alternatives of sections of a resonator according to the invention.
Figure 7:
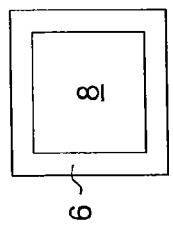

The tuning fork 11, advantageously according to the invention, has thermal coefficients to the first order α or even to the second order β which are compensated for by the deposition of a coating 12, 14, 16 against the core 18 of the body 15. FIGS. 6 and 7 suggest 2 non-exhaustive sectional examples of the body 15 of the tuning fork 11 according to the plane A-A. The sections in the shape of a grooved quadrilateral show the core 18 of the body 15 covered by at least one coating 12, 14, 16 over at least a part as one or a plurality of faces or even the entirety of the exterior surface of the body 15. As in the first example, the coatings 12, 14, 16 are not to scale relative to the dimensions of the core 18, this is in order to show more clearly the locations of each part.

The core 8, 18 of the resonator 1, 11 can be formed by a ceramic, a silicon-based material or a quartz-based material. However, that involves a large variety of material. This is why materials which have low thermoelastic (CTE) and expansion coefficients ($\alpha_{spi}$) are preferred.

It is therefore possible to use quartz glass, likewise termed fused quartz just as readily as crystallised quartz.

According to the manufacturing method of the first material, the value of the thermoelastic coefficient (CTE) which is obtained is generally low and positive or negative, i.e. between 100 and 500 ppm. $°C.^{-1}$.

Consequently, the coating 2, 4, 6, 12, 14, 16 has a thermoelastic coefficient (CTE) which is negative or positive. As explained above, such a coating can therefore comprise a shape-memory metallic alloy, such as preferably an alloy based on Cu—Zn, Co—Ni, Ni—Ti or Cu—Al. By way of example, the core 8, 18 made of monocrystalline silicon of a resonator, 1, 11 according to the invention can thus be thermally compensated for by means of a coating 2, 4, 6, 12, 14, 16 based on Ni—Ti of the order of a micrometer which has a thermoelastic coefficient (CTE) which is positive.

As explained above, it is understood that the first material can comprise a thermoelastic coefficient (CTE) to the first order and second order which can be positive as well as negative. This is why the coating or coatings 2, 4, 6, 12, 14, 16 which are used for the core 8, 18 can incidentally comprise thermoelastic coefficients (CTE) to the first order and to the second order, negative as well as positive.

For preference, deposition of the coating 2, 4, 6, 12, 14, 16, made of a shape-memory metal, is of the sputtering type. Optionally, a bonding layer, such as chromium, can likewise be deposited before the main coating 2, 4, 6, 12, 14, 16 in order to improve the adhesion and/or the permeability of said coating.

What is claimed is:

1. A thermocompensated resonator comprising:
a body that is deformed in use, the core of the body being formed by a first material, at least one part of the body including at least one coating made of a shape-memory metallic alloy, a thermoelastic coefficient of the shape-memory metallic alloy having an opposite sign to a thermoelastic coefficient of the first material so as to allow said resonator to have a frequency variation as a function of temperature which is substantially zero at least to the first order, wherein the thermoelastic coefficient of the shape-memory metallic alloy represents variations in Young's modulus of the shape-memory metallic alloy as a function of temperature and the thermoelastic coefficient of the first material represents variations in Young's modulus of the first material as a function of temperature.

2. The resonator according to claim 1, wherein the core of the body comprises glass, metallic glass, technical ceramic or ceramic glass.

3. The resonator according to claim 1, wherein the core of the body comprises monocrystalline silicon which is doped or not, or polycrystalline silicon which is doped or not.

4. The resonator according to claim 1, wherein the core of the body comprises quartz.

5. The resonator according to claim 1, wherein said shape-memory metallic alloy of said at least one coating comprises an alloy based on Cu—Zn, Co—Ni, Ni—Ti or Cu—Al.

6. The resonator according to claim 1, wherein the body comprises a section substantially in the shape of a quadrilateral, the faces of which are identical in pairs.

7. The resonator according to claim 1, wherein the body comprises a section which is substantially in the shape of a quadrilateral, the faces of which are completely coated.

8. The resonator according to claim 1, wherein said at least one coating forms a barrier against humidity.

9. The resonator according to claim 1, wherein said at least one coating is paramagnetic or diamagnetic.

10. The resonator according to claim 1, wherein the body is a bar which is coiled to form a balance spring and is coupled to a flywheel.

11. The resonator according to claim 1, wherein the body comprises at least two bars which are mounted symmetrically so as to form a tuning fork.

12. A timepiece, comprising at least one resonator according to claim 1.

* * * * *